United States Patent [19]
Chan et al.

[11] Patent Number: 6,140,846
[45] Date of Patent: Oct. 31, 2000

[54] DRIVER CIRCUIT CONFIGURED FOR USE WITH RECEIVER

[75] Inventors: Francis Chan, Williston; Steven P. Koch, Underhill; Douglas W. Stout, Milton, all of Vt.

[73] Assignee: International Business Machines Corporation, Armonk, N.Y.

[21] Appl. No.: 09/183,707

[22] Filed: Oct. 30, 1998

[51] Int. Cl.[7] .............................. H03B 1/00; H03K 3/00
[52] U.S. Cl. ........................................... 327/108; 327/534
[58] Field of Search ................................... 327/108, 112, 327/534, 535, 537; 326/63, 80

[56] References Cited

U.S. PATENT DOCUMENTS

| | | | |
|---|---|---|---|
| 4,958,091 | 9/1990 | Roberts | 326/81 |
| 4,985,644 | 1/1991 | Okihara et al. | 326/27 |
| 5,298,804 | 3/1994 | Shichinohe | 326/63 |
| 5,321,324 | 6/1994 | Hardee et al. | 326/62 |
| 5,396,128 | 3/1995 | Dunning et al. | 326/68 |
| 5,430,404 | 7/1995 | Campbell et al. | 327/566 |
| 5,479,116 | 12/1995 | Sallaerts et al. | 326/80 |
| 5,546,033 | 8/1996 | Campbell et al. | 327/170 |
| 5,583,454 | 12/1996 | Hawkins et al. | 326/81 |
| 5,656,970 | 8/1997 | Campbell et al. | 327/565 |
| 5,668,483 | 9/1997 | Roohparvar | 326/34 |
| 5,995,010 | 11/1999 | Blake et al. | 340/653 |

*Primary Examiner*—Terry D. Cunningham
*Assistant Examiner*—Quan Tra
*Attorney, Agent, or Firm*—Ratner & Prestia; Eugene I. Shkurko

[57] ABSTRACT

A driver circuit has an input terminal at which a first signal having a first voltage swing is applied, and an output terminal at which: (i) a second signal having a second voltage swing is provided to external circuitry, and (ii) a third signal having a third voltage swing is received from the external circuitry. A level shifter circuit is coupled to the input terminal and translates the first signal to the second signal. The level shifter circuit includes circuitry which regulates the switching rate of the driver circuit. An output circuit is coupled between the level shifter circuit and the output terminal which drives the external circuitry with the second signal received from the level shifter circuit. The output circuit has a floating well, and a bias circuit is coupled between the output terminal and the well of the output circuit. The bias circuit biases the well proportional to the third voltage swing when the third signal is received at the output terminal. A feedback circuit is coupled between the output terminal and the output circuit. The feedback circuit deactivates at least a portion of the output circuit responsive to the third signal being received at the output terminal.

21 Claims, 3 Drawing Sheets

300

DRIVER CIRCUIT CONFIGURED FOR USE WITH RECEIVER

TECHNICAL FIELD

The present invention relates generally to driver circuits and, more particularly, to a driver circuit which translates a signal from a first voltage swing to a second voltage swing, and which is capable of interfacing with external circuitry operating at a third voltage swing.

BACKGROUND OF THE INVENTION

When interfacing with an input/output (I/O) device, an I/O interface is used. So that the I/O interface may communicate properly with the I/O device, a certain output voltage swing is typically desired. This voltage swing may be provided by a driver circuit situated within the I/O interface. The driver circuit may be in the form of a microprocessor device.

Microprocessor devices typically are powered by voltage supplies that may provide, for example, a voltage swing between 0 and Vdd1. This voltage swing may be different than the voltage swing requirements of an external device to which the interface is coupled. For example, the I/O device may desirably rely upon a voltage swing between 0 and Vdd2 volts. The difference between Vdd1 and Vdd2, if any, will depend on requirements of desired applications. In most applications, Vdd2 is greater than Vdd1. For example, Vdd2 may be 3.3 volts while Vdd1 may be 2.5 volts.

If the microprocessor voltage swings between 0 and Vdd1 and the external device relies upon a voltage swing between 0 and Vdd2, a conversion is desirably implemented so that the driver circuit and the external device may communicate. To enable this communication, a translation circuit may be used. Various circuits for performing such conversions are well known in the art.

In some applications, it is desirable not only to use the driver circuit to translate between voltage swings, but also as part of a receiver environment. A driver circuit 300 configured for use in such an environment is illustrated in FIG. 3. Translation circuitry is represented in FIG. 3 by: (i) nFET 320 and nFET 322, configured as a first pass gate, and (ii) pFET 324, pFET 326, and nFET 328, configured as a half-latch. The translation circuitry amplifies a data signal 308 applied to input terminal 310. In particular, the voltage swing of data signal 308 is amplified from a swing between 0 and Vdd1 volts to a swing between 0 and Vdd2 volts. The amplified data signal is provided to an output stage of driver circuit 300 which includes "top" pFET 304 and "bottom" pFET 306. Both pFETs 304 and 306 are coupled to the external circuitry through output terminal 302, and function to drive the external circuitry at a level of Vdd2 volts when data signal 308 has a state of logical '1', i.e., a level of Vdd1 volts.

Driver circuit 300 interfaces with an off-chip receiver (not shown) through a conventional I/O interface at output terminal 302. In some applications, the receiver voltage swings between 0 and Vdd3, where Vdd3 is greater than Vdd1 and Vdd2. In one example, the driver circuit translates a signal which swings between 0 volts and 2.5 volts to a signal which swings between 0 volts and 3.3 volts, and the receiver operates at 5 volts. Because the receiver is coupled to output terminal 302 of driver circuit 300, it is possible that Vdd3 may be passed from the receiver to driver circuit 300. If Vdd3 sufficiently exceeds Vdd1 and Vdd2, voltage Vdd3 could cause improper operation of driver circuit 300 and potentially destroy transistors within driver circuit 300. To prevent these effects, driver circuit 300 includes feedback circuitry, represented by transistors 258, 260, 262, and 264, configured as illustrated in FIG. 3. The feedback circuitry is coupled between output terminal 302 and "top" pFET 304 of the output stage to deactivate pFET 306 at times when Vdd3 is received at output terminal 302.

As illustrated in FIG. 3, driver circuit 300 further includes nFET 314, and pFETs 316 and 318, configured as a second pass gate. This second pass gate is coupled between input terminal 310 of driver circuit 300 and "top" pFET 304 of the output stage. In this way, the pass-gate circuitry isolates transistors in driver circuit 300 from Vdd3 at times when Vdd3 is received from the external circuitry at output terminal 302.

Some of the pFETs in driver circuit 300 share a common n-well 312. To bias n-well 312, driver circuit 300 includes bias circuitry represented in driver circuit 300 by pFETS 250, 252, 254, and 256, configured as illustrated in FIG. 3. This bias circuitry is coupled between output terminal 302 and n-well 312 shared by pFETs 304 and 306. When Vdd3 is received at output terminal 302, the bias circuitry responds by biasing n-well 312 to a potential substantially as high as Vdd3.

As performance requirements imposed on modern driver circuits become increasingly demanding, it becomes more important to control the slew rate, or switching rate, of the output of a driver circuit. Otherwise, noise levels in the driver circuit could be so great as to hinder the overall performance of the circuit itself and the I/O interface in which it is situated. In addition, to satisfy higher performance requirements, it becomes more important to minimize the number of functional blocks of circuitry, or "stages," in the driver circuit. This, in turn, increases the switching speed of the driver circuit in response to the input data signal 308 changing states. Circuits such as driver circuit 300 do not include means, however, for readily controlling slew rate. In addition, stages of driver circuit 300 may be eliminated, particularly the pass gate circuitry, thus increasing circuit speed while achieving the same overall functionality.

SUMMARY OF THE INVENTION

The present invention relates to a driver circuit including an input terminal at which a first signal having a first voltage swing is applied, and an output terminal at which: (i) a second signal having a second voltage swing is provided to external circuitry, and (ii) a third signal having a third voltage swing is received from the external circuitry. A level shifter circuit is coupled to the input terminal and translates the first signal to the second signal. The level shifter circuit includes circuitry which regulates the switching rate of the driver circuit. An output circuit is coupled between the level shifter circuit and the output terminal. The output circuit drives the external circuitry with the second signal received from the level shifter circuit. The output circuit has a well, and a bias circuit is coupled between the output terminal and the well of the output circuit. The bias circuit biases the well proportional to the third voltage swing when the third signal is received at the output terminal.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 1:
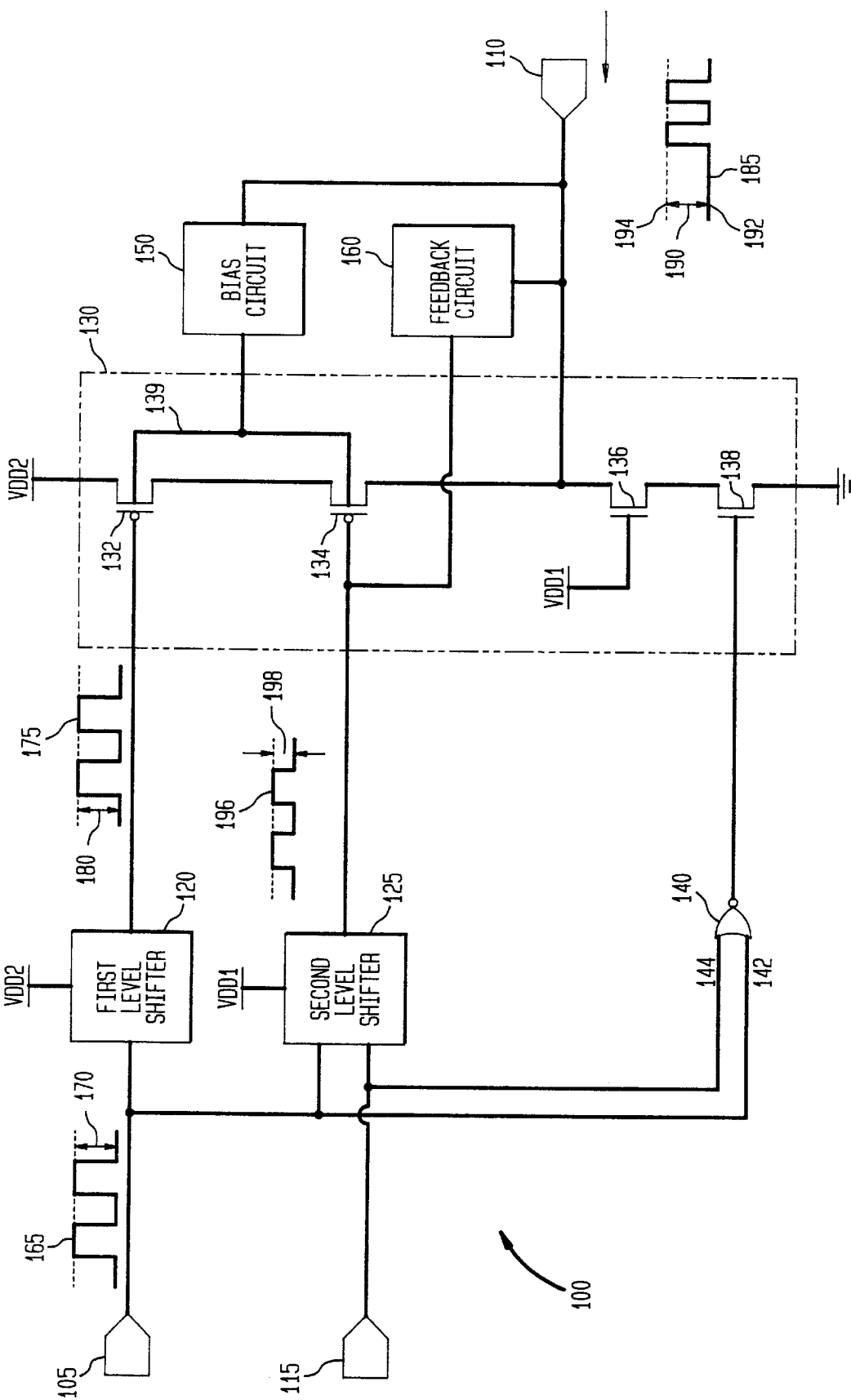
FIG. 1 is a block diagram of a driver circuit according to an exemplary embodiment of the present invention.

FIG. 1 is a block diagram of a driver circuit 100 according to an exemplary embodiment of the present invention. Driver circuit 100 is powered by a first voltage source Vdd1 and a second voltage source Vdd2. Typically, Vdd1 is about 2.5 volts and Vdd2 is about 3.3 volts. Driver circuit 100 includes an input terminal 105, an output terminal 110, and a control terminal 115. In most applications, output terminal 110 would be coupled to a receiver (not shown). A first level shifter circuit 120 is coupled to input terminal 105 and powered by Vdd2. A second level shifter circuit 125 is coupled to both input terminal 105 and control terminal 115 and is powered by Vdd1.

Driver circuit 100 further includes an output circuit 130 coupled to output terminal 110. In the embodiment illustrated in FIG. 1, output circuit 130 includes four transistors, namely first pFET 132, second pFET 134, first nFET 136, and second nFET 138, configured as illustrated in FIG. 1. The pFETs 132 and 134 share a common n-well 139. The gate of first pFET 132 is coupled to the output of first level shifter circuit 120. Second voltage source Vdd2 is applied to the source of first pFET 132, and the drain of first pFET 132 is coupled to the source of second pFET 134. The gate of second pFET 134 is coupled to the output of second level shifter 125, and the drain of second pFET 134 is coupled to output terminal 110. By configuring first pFET 132 and second pFET 134 in this way, output circuit 130 can be coupled between output terminal 110 and level shifters 120, 125, respectively.

First voltage source Vdd1 is applied to the gate of first nFET 136. The source of first nFET 136 is coupled to output terminal 110, and the drain of first nFET 136 is coupled to the source of second nFET 138. Current from the drain of second nFET 138 is conducted to ground. Although output circuit 130 is described as having two pFETs and two nFETs, configured as illustrated in FIG. 1, output circuit 130 is not intended to be limited to this particular example. Output circuit 130 may include any number, type, or configuration of transistors adapted to drive external circuitry (not shown), as is contemplated within the scope of the present invention.

Driver circuit 100 further includes a NOR gate 140, the output of which is coupled to the gate of second nFET 138. NOR gate 140 has a first input 142 coupled to input terminal 105 and a second input 144 coupled to control terminal 115. Driver circuit 100 further includes: (i) a bias circuit 150 coupled between output terminal 110 and n-well 139 shared by pFETs 132 and 134 of output circuit 130, and (ii) a feedback circuit 160 coupled between output terminal 110 and the gate of second pFET 134 of output circuit 130.

When driver circuit 100 is in operation, a first signal 165 having a first voltage swing 170 is applied to input terminal 105. First signal 165 is preferably a data signal, although other types of signals may be used. Typically, first voltage swing 170 ranges from about 0 volts to about 2.5 volts, although other voltage swings are contemplated. First level shifter circuit 120 translates first signal 165 to a second signal 175 having a second voltage swing 180, which is provided to the gate of first pFET 132 of output circuit 130 to drive external circuitry (not shown). Second voltage swing 180 is larger than first voltage swing 170 and ranges from about 0 volts to about 3.3 volts. As such, by translating first signal 165 to second signal 175, first level shifter circuit 120 provides pre-drive to first pFET 132 of output circuit 130.

At certain times, a third signal 185 having a third voltage swing 190 is received at output terminal 110 from the external circuitry. Third voltage swing 190 ranges between a lower level 192, typically about 0 volts, and an upper level 194, typically exceeding about 3.8 volts. In this example, upper level 194 is 5 volts. When third signal 185 is received at output terminal 110, bias circuit 150 responds by biasing n-well 139, shared by pFETs 132 and 134, proportional to third voltage swing 190. When third signal 185, received at output terminal 110, is at upper level 194, bias circuit 150 biases n-well 139 to a potential substantially as high as upper level 194. Also, when third signal 185 is at upper level 194, feedback circuit 160 deactivates second pFET 134 of output circuit 130. Biasing well 139 as a function of the voltage at output terminal 110 is advantageous, as it prevents current from flowing from output terminal 110 into n-well 139 when the potential at output terminal 110 is higher than the potential of n-well 139. For example, if the potential at output terminal 110 becomes 5 volts, but the potential of n-well 139 is allowed to remain at 3.3 volts or 2.5 volts, current may flow from output terminal 110 into n-well 139.

When first level shifter circuit 120 is translating first signal 165 to second signal 175, second level shifter circuit 125 also translates first signal 165 to a fourth signal 196 having a fourth voltage swing 198. Typically, fourth voltage swing 198 ranges between about 0.6 volts to about 1.9 volts. In this way, second level shifter 125 provides a bias of about 0.6 volts to the gate of second pFET 134 of output circuit 130 to prevent oxide breakdown of second pFET 134 in the event of overshoot on output terminal 110. Such oxide breakdown may occur if the voltage between the gate and the source of second pFET 134 exceeds a predetermined value. In this particular technology, this value is about 3.6 volts.

Figure 2:
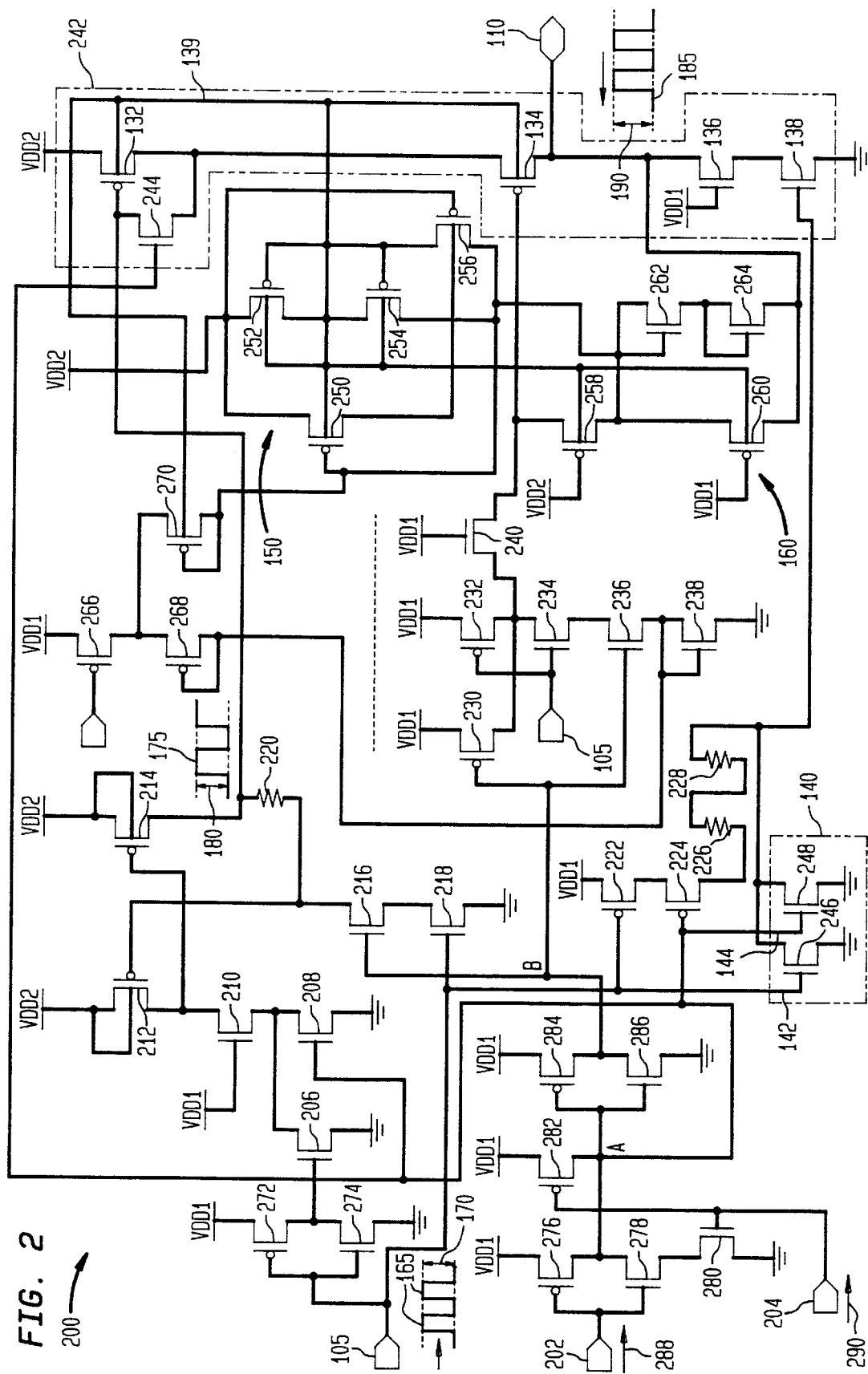
FIG. 2 is a block diagram showing internal circuitry of the blocks of the driver circuit of FIG. 1.

FIG. 2 is a block diagram of a driver circuit 200 according to another exemplary embodiment of the present invention. Driver circuit 200 is generally similar in function to driver circuit 100 of FIG. 1, but further illustrates the internal circuitry of several functional blocks of driver circuit 100, according to one example. Moreover, driver circuit 200 introduces several additional aspects of the present invention in addition to those already described in driver circuit 100. As with driver circuit 100 of FIG. 1, driver circuit 200 includes input terminal 105 and output terminal 110. Control terminal 115 of driver circuit 100 is replaced by first control terminal 202 and second control terminal 204 in driver circuit 200, as illustrated in FIG. 2.

In FIG. 2, first level shifter circuit 120 of FIG. 1 is represented in driver circuit 200 by transistors 206, 208, 210, 212, 214, 216, and 218 and by resistor 220. Transistors 206, 208, 210, 216, and 218 are preferably nFETs and transistors 212 and 214 are preferably pFETs, for reasons which will become apparent when the modes of operation of driver circuit 200 are described below. The pFETs 212 and 214 are powered by Vdd2, typically about 3.3 volts, to translate first signal 165 to second signal 175. Vdd2 is also applied to the n-wells of pFETs 212 and 214 to assist in driving second signal 175 at a voltage swing between about 0 and 3.3 volts. Other choices and configurations of transistors which translate a signal from first voltage swing 170, typically about 0 to 2.5 volts, to second voltage swing 180, typically about 0 to 3.3 volts, are contemplated as other possible implementations of first level shifter circuit 120.

The nFETs 216 and 218 and resistor 220 of driver circuit 200 function collectively as circuitry which regulates the switching rate of portions of driver circuit 200. The respective and relative values of nFETs 216, 218 and resistor 220 may be adjusted to control di/dt of driver circuit 200. By the same token, adjustments to these values control output dv/dt of output circuit 242 for positive going transitions. Regulation of di/dt of driver circuit 200 and output dv/dt for negative going transitions is accomplished by including transistors 222, 224, and resistors 226, 228, the respective and relative values of which may be adjusted as desired to control output dv/dt and di/dt. Regulation of dv/dt and di/dt, or "slew rate" control, may also be accomplished by selecting appropriate transistor sizes.

In FIG. 2, second level shifter circuit 125 of FIG. 1 is represented in driver circuit 200 by transistors 230, 232, 234, 236, 238, and 240. Transistors 234, 236, 238, and 240 are preferably nFETs and transistors 230 and 232 are preferably pFETs, for reasons which will become apparent when the modes of operation of driver circuit 200 are described below. By implementing second level shifter circuit 125 as shown in FIG. 2, second level shifter circuit 125 translates first signal 165, typically ranging between about 0 and 2.5 volts, to fourth signal 196, typically ranging between about 0.6 and 1.9 volts, as described above. As such, fourth signal 196 of FIG. 1 biases the gate of second pFET 134 of output circuit 130 with about 0.6 volts to prevent oxide breakdown of second pFET 134, as described above. Other types and configurations of transistors which translate a signal from first voltage swing 170, typically about 0 to 2.5 volts, to fourth voltage swing 198, typically about 0.6 to 1.9 volts, are contemplated as other possible implementations of second level shifter circuit 125.

Figure 3:
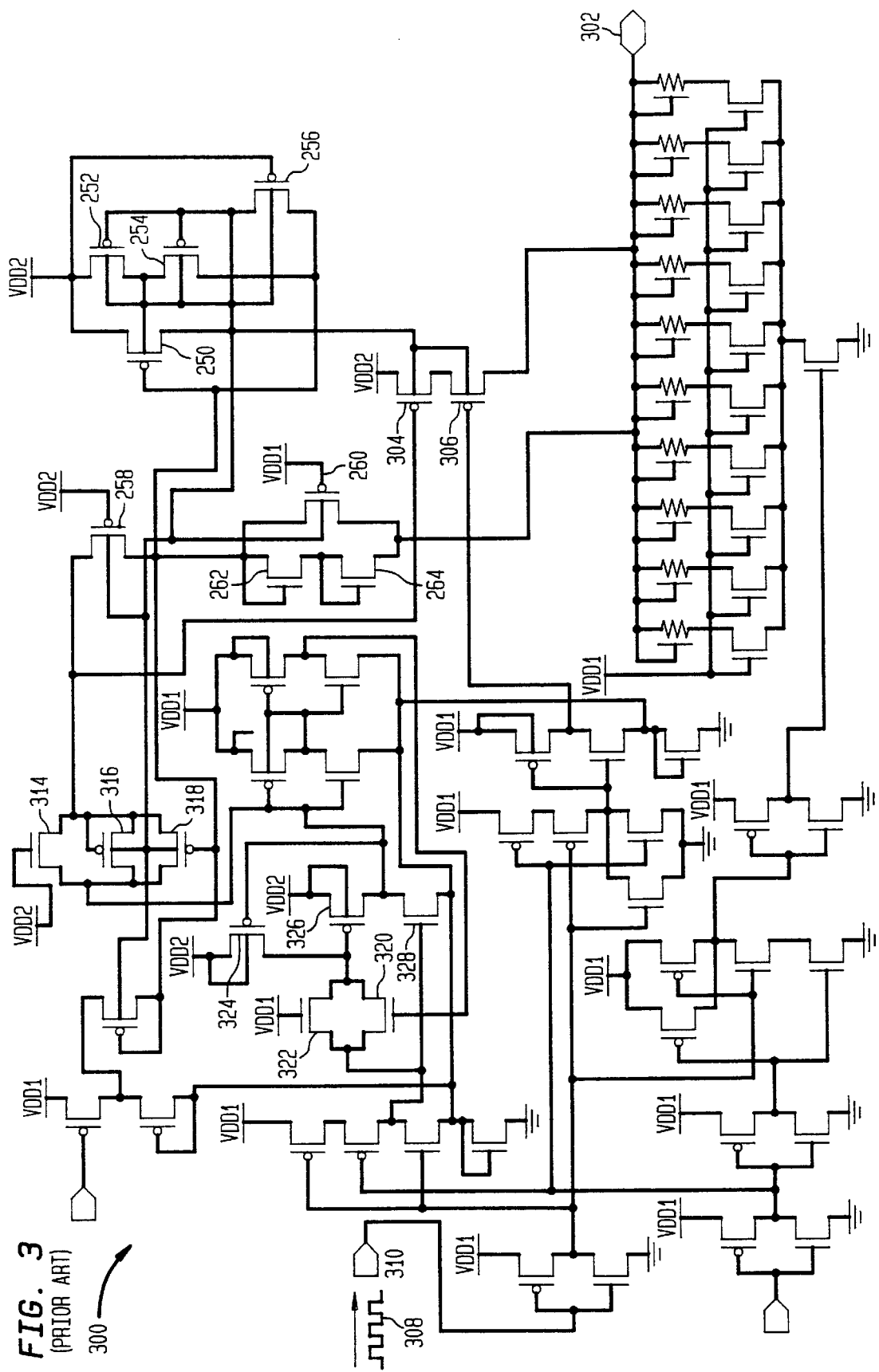
FIG. 3 is a block diagram of a driver circuit.

Because feedback circuit 160 is coupled to "bottom" or second pFET 134 rather than "top" or first pFET 132, unlike driver circuit 300 of FIG. 3, transistor 240 replaces pass gate circuitry (transistors 314, 316, 318) of driver circuit 300 in favor of a single transistor 240. This transistor 240 isolates transistors in driver circuit 200 from an excessive third voltage signal 185 appearing at out-put terminal 110, similar to the pass gate circuitry in driver circuit 300, but does so by feeding back to the "bottom" pFET rather than to the "top" pFET. As such, feedback circuit 160 provides the same function as the feedback circuit in driver circuit 300, but does so: (i) with fewer components, and (ii) without interfering with the critical path, that is, the signal path between input terminal 105 and first pFET 132 of output circuit 130. By replacing the pass gate circuitry of FIG. 3 with transistor 240 of FIG. 2, a stage of driver circuit 300 is effectively eliminated, thus increasing system speed and improving overall circuit performance.

Driver circuit 200 includes output circuit 242, similar to output circuit 130 of FIG. 1 as it includes transistors 132, 134, 136, and 138 similarly configured, such that output circuit 242 is coupled to output terminal 110. Output circuit 242 further includes nFET 244 coupled to first pFET 132 as illustrated in FIG. 2.

NOR gate 140 of driver circuit 100 is represented in driver circuit 200 by nFETs 246 and 248, pfets 222, 224 and resistors 226, 228, configured as illustrated in FIG. 2. The respective drains of nFETs 246 and 248 define the output of NOR gate 140 which is coupled to the gate of second nFET 138 of output circuit 242. The gate of nFET 246 defines first input 142 of NOR gate 140 and is coupled to input terminal 105. The gate of nFET 248 defines second input 144 of NOR gate 140 and is coupled to first control terminal 202.

Bias circuit 150 of driver circuit 100 is represented in driver circuit 200 by transistors 250, 252, 254, and 256, configured as illustrated in FIG. 2. Transistors 250, 252, 254, and 256 are preferably pFETs, for reasons which will become apparent when the modes of operation of driver circuit 200 are described below. Other types and configurations of transistors which may be coupled between output terminal 110 and n-well 139 shared by pFETs 132 and 134 of output circuit 130 to bias n-well 139 at times when third signal 185 is received at output terminal 110, as described above, are contemplated as other possible embodiments of bias circuit 150.

Feedback circuit 160 of driver circuit 100 is represented in driver circuit 200 by transistors 258, 260, 262, and 264, configured as illustrated in FIG. 2. Transistors 258 and 260 are preferably pFETs and transistors 262 and 264 are preferably nFETs, for reasons which will become apparent when the modes of operation of driver circuit 200 are described below. Other types and configurations of transistors which could be coupled between output terminal 110 and second pFET 134 of output circuit 130, to deactivate second pFET 134 of output circuit 130 at times when third signal 185 is received at output terminal 110, as described above, are contemplated as other possible embodiments of feedback circuit 160.

One aspect of driver circuit 200 which is not included in driver circuit 100, is transistors 266, 268, and 270, configured as illustrated in FIG. 2, to function collectively as charging circuitry for nFET 238 and portions of bias circuit 150 and feedback circuit 160. Transistors 266, 268, and 270 are preferably pFETs, as illustrated in FIG. 2. The gate and drain of pFET 268 are coupled to the gate and source of nFET 238. Vdd1 is applied to the source of pFET 266. The gate and drain of pFET 270 are coupled to the gate of pFET 250 which, in turn, is coupled to other transistors in bias circuit 150 160 and feedback circuit 160, as illustrated in FIG. 2. In this way, the charging circuitry provides current to the respective portions of second level shifter circuit 125, bias circuit 150, and feedback circuit 160 to maintain voltage levels at nodes where leakage might occur when driver circuit 200 is in operation.

Several additional aspects of driver circuit 200 include: (i) transistors 276, 278, 280, and 282, configured as illustrated in FIG. 2, to define a NAND gate having first control terminal 202 and second control terminal 204 as input lines, and (ii) transistors 284 and 286 configured as illustrated in FIG. 2. Transistors 284 and 286 define an inverter having an input coupled to the output of the NAND gate at node A, and an output coupled to transistor 216 of the first level shifter circuit 120 and transistors 230 and 236 of the second level shifter circuit 125 at node B. The reasons for including these additional aspects of driver circuit 200 will be more apparent when considering the modes of operation described below.

Modes of Operation

The modes of operation of driver circuits 100 and 200, as illustrated in FIGS. 1 and 2, are herein described to illustrate the functionality of particular transistors of driver circuit 200, as well as the more general functionality of groupings of those transistors which define the functional circuit blocks of driver circuit 100. To facilitate understanding, voltage sources are assigned specific values. In this example, Vdd1 is about 2.5 volts and Vdd2 is about 3.3 volts. Voltage swings of particular signals are also represented by specific values, as will be described below. These values are only exemplary, however, and are not intended to limit either the scope or the possible applications of the present invention.

The active mode and receive mode are the two modes of operation of driver circuit 200. At any given time, the particular mode of operation is determined by the respective states of: (i) a tri-state signal 288 applied to first control terminal 202, and (ii) a driver inhibit signal 290 applied to second control terminal 204. Table 1 shows the possible states of these control signals 288 and 290 and which mode is selected accordingly.

TABLE 1

| Mode of Operation | | |
|---|---|---|
| Tri-State 288 | Driver Inhibit 290 | Mode of Operation |
| 1 | 1 | Active |
| 0 | X | Receive |
| X | 0 | Receive |

In this example, logical '1' is represented by about 2.5 volts, and logical '0' is represented by about 0 volts. As such, tri-state signal 288 and driver inhibit signal 290 both swing between about 0 and about 2.5volts, respectively, similar to first signal 165.

In either active mode or receive mode, when the voltage at output terminal 110 is at about 0 volts, nFETs 262 and 264 pass about 1.2 volts to pFET 250. Because 3.3 volts is applied to the source of pFET 250, pFET 250 will turn on. The n-well of pFET 250, which shares n-well 139 of output circuit 242, will develop a potential of 3.3 volts. Thus, the n-well is effectively biased at about 3.3 volts when the voltage at output terminal 110 is at about 0 volts.

A. Active Mode

In active mode, it is desirable that driver circuit 200 drive external circuitry (not shown) with first signal 165, applied to input terminal 105. Control signals 288 and 290 both have a state of logical '1' or 2.5 volts. First signal 165 swings between about 0 volts and about 2.5 volts, and the external circuitry operates between about 0 and 3.3 volts. Accordingly, it is desirable that the voltage at output terminal 110 becomes: (i) 3.3 volts when first signal 165 becomes 2.5 volts, and (ii) 0 volts when first signal 165 becomes 0 volts.

At time t₀, when first signal 165 becomes 2.5 volts, nFET 218 turns on. The inverter defined by transistors 272 and 274 inverts first signal 165, causing nFET 206 to turn off. Control signals 288 and 290 are both at 2.5 volts, so a NAND operation performed by transistors 276, 278, 280, and 282 causes node A to become 0 volts. The inverter defined by transistors 284 and 286 inverts the state at node A, causing node B to become 2.5 volts and turning on nFET 216. Having nFETs 216 and 218 on, and current from the drain of nFET 218 being conducted to ground, pulls the gate of pFET 212 down to about 0 volts, causing pFET 212 to turn on. Because the drain of pFET 212 is coupled to the gate of pFET 214, activating pFET 212 turns off pFET 214 which, in turn, turns on first pFET 132 of output circuit 242 at about 3.3 volts.

Still at time t₀, node B becomes 2.5 volts, turns off pFET 230 and turns on nFET 236. First signal 165 is still at 2.5 volts, so pFET 232 turns off and nFET 234 turns on. The nFET 240, with 2.5 volts applied to its gate and configured as shown in FIG. 2, provides about a 0.6 volt bias to second pFET 134 of output circuit 242, turning on second pFET 134. The 2.5 volts at input terminal 105 cause transistor (pFET) 222 to turn off and nFET 246 to turn on. Because node A is still at 0 volts, transistor (pFET) 224 is on and nFET 248 is off. Turning off pFET 222 deactivates second nFET 138 of output circuit 242 through resistors 226 and 228. The values of resistors 226 and 228 determine the switching rate of second nFET 138 responsive to pFET 222 turning on. Even though first nFET 136 is on, because the gate of first nFET 136 is tied to 2.5 volts, having first pFET 132 on at 3.3 volts and second nFET 138 off causes the voltage at output terminal 110160 to become about 3.3 volts.

At time t₁, when first signal 165 becomes 0 volts, nFET 218 turns off. The inverter defined by transistors 272 and 274 inverts first signal 165, causing nFETs 206 and 208 to turn on. The nFET 210 is on because 2.5 volts are applied to its gate. Control signals 288 and 290 are still at 2.5 volts, so node A is still at about 0 volts, node B at about 2.5 volts, and nFET 216 is turned on. Because nFET 218 is off, however, the gate of pFET 212 cannot be pulled down to 0 volts, causing pFET 212 to turn off. The nFETs 206, 208, and 210 are on and pFET 212 is turned off. As a result, pFET 214 turns on. Activating pFET 214 turns off first pFET 132 of output circuit 242.

Still at time t₁, 0 volts at input terminal 105 causes pFET 222 to turn on and nFET 246 to turn off. Because node A is still at 0 volts, pFET 224 is on and nFET 248 is off. Having pFETs 222 and 224 on activates second nFET 138 of output circuit 242 through resistors 226 and 228. The values of resistors 226 and 228 determine the switching rate of second nFET 138 responsive to pFET 222 turning on. The first nFET 136 is on because the gate of first nFET 136 is tied to 2.5 volts. Having first pFET 132 off and nFETs 136, 138 of output circuit 242 on causes the voltage at output terminal 110 to become about 0 volts.

B. Receive Mode

In receive mode, a receiver (not shown) receives third signal 185 and passes it to output terminal 110 of driver circuit 200. Consequently, it is desirable to deactivate output circuit 242 of driver circuit 200, thus preventing driver circuit 200 from translating first signal 165 to drive external circuitry (not shown). As explained above, driver circuit 200 will go into receive mode when either tri-state signal 288 or driver inhibit signal 290 become about 0 volts.

At time t₂, when either tri-state signal 288 or driver inhibit signal 290 becomes 0 volts, the NAND gate defined by transistors 276, 278, 280, and 282 causes node A to become about 2.5 volts. Having node A at 2.5 volts causes pFET 224 to turn off and nFET 248 to turn on, which causes second nFET 138 of output circuit 242 to turn off. The inverter defined by transistors 284 and 286 causes node B to become about 0 volts, which turns off nFET 216. Turning off nFET 216 prevents the gate of first pFET 132 from being pulled to 0 volts. Node A going to 2.5 volts also causes nFET 208 to turn on. Because nFET 210 is on, nFET 208 turning on pulls the gate of pFET 214 down to about 0 volts, which pulls the gate of first pFET 132 up to about 3.3 volts. Thus, first pFET 132 is turned off. Having pFETs 132 and 134 of output circuit 242 turned off ensures that output circuit 242 is inactive.

Still at time t₂, third signal 185 changes states to about 5 volts. When the potential at output terminal 110 changes to 5 volts, pFET 260 passes the 5 volts to the drain of pFET 256, as the gate of pFET 260 is tied to 2.5 volts. The pFET 256 turns on as the gate of pFET 256 is tied to 3.3 volts. When pFET 256 turns on, pFET 256 passes about 5 volts to n-well 139 to bias n-well 139 to a potential substantially as high as the voltage at output terminal 110. When the voltage at output terminal 110 becomes 5 volts, it is desirable to turn off second pFET 134 of output circuit 242 so second pFET 134 will not pass the 5 volts through first pFET 132 of output circuit 242 and into power supply Vdd2 applied to the source of first pFET 132. Hence, pFET 260, which is active by virtue of the 2.5 volt power supply applied to its gate, and pFET 258, active by virtue of the 3.3 volt power supply applied to its gate, pass the 5 volt signal at output terminal 110 to the gate of second pFET 134, turning off second pFET 134. In this way, output circuit 242 is broken, thus preventing the 5 volts from passing through first pFET 132 into power supply Vdd2.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A driver circuit comprising:
   an input terminal at which a first signal having a first voltage swing is applied;
   an output terminal at which:
     i) a drive signal having a second voltage swing is provided to external circuitry, and
     ii) a third signal having a third voltage swing is received from the external circuitry;
   a level shifter circuit, coupled to the input terminal, which translates the first signal to a second signal and includes voltage regulation circuitry which regulates a switching rate of the driver circuit;
   an output circuit, coupled between the level shifter circuit and the output terminal, which drives the external circuitry with the drive signal based on the second signal received from the level shifter circuit, the output circuit having a well; and
   a bias circuit, coupled between the output terminal and the well of the output circuit, which biases the well proportional to the third voltage swing responsive to the third signal being received at the output terminal.

2. The driver circuit according to claim 1, wherein the output circuit includes at least two transistors sharing the well.

3. The driver circuit according to claim 2, wherein the transistors are pFETs and the well is an n-well.

4. The driver circuit according to claim 1, wherein:
   i) the third voltage swing ranges between a first level and second level, and
   ii) the bias circuit biases the well to a potential substantially as high as the second level of the third voltage swing.

5. The driver circuit according to claim 1, wherein the voltage regulation circuitry includes a resistor and a transistor in series with one another, respective and relative values of which determine the switching rate of the driver circuit, the resistor and transistor coupled between the level shifter and a first power source.

6. The driver circuit according to claim 1, wherein the level shifter circuit includes means for limiting the rate of change of voltage of the translated second signal.

7. The driver circuit according to claim 1, further comprising a feedback circuit, coupled between the output terminal and the output circuit, which deactivates at least a portion of the output circuit responsive to the third signal being received at the output terminal.

8. The driver circuit according to claim 1, wherein the third voltage swing is larger than the second voltage swing.

9. The driver circuit according to claim 1, wherein the first voltage swing ranges from about 0 volts to about 2.5 volts.

10. The driver circuit according to claim 1, wherein the second voltage swing ranges from about 0 volts to about 3.3 volts.

11. The driver circuit according to claim 1, wherein the third voltage swing ranges from about 0 volts to about 5 volts.

12. A driver circuit comprising:
    an input terminal at which a first signal having a first voltage swing is applied;
    an output terminal at which:
      i) a drive signal having a second voltage swing is provided to external circuitry, and
      ii) a third signal having a third voltage swing is received from the external circuitry;
    a level shifter circuit, coupled to the input terminal, which translate the first signal to a second signal;
    an output circuit, coupled between the level shifter circuit and the output terminal, which drives the external circuitry with the drive signal based on the second signal received from the level shifter circuit; and
    a feedback circuit, coupled between the output terminal and the output circuit, which deactivates at least a portion of the output circuit responsive to the third signal being received at the output terminal.

13. The driver circuit according to claim 12, wherein the output circuit includes at least two transistors.

14. The driver circuit according to claim 13, wherein the transistors are pFETs.

15. A driver circuit comprising:
    an input terminal at which a first signal having a first voltage swing is applied;
    an output terminal at which:
      i) a drive signal having a second voltage swing is provided to external circuitry, and
      ii) a third signal having a third voltage swing is received from the external circuitry,
    a level shifter circuit, coupled to the input terminal, which translates the first signal to a second signal;
    an output circuit having:
      i) a first transistor coupled to the level shifter circuit,
      ii) a second transistor coupled between the first transistor and the output terminal, and
      iii) a well shared by the first transistor and the second transistor,
    the output circuit driving the external circuitry with the drive signal based on the second signal received by the first transistor from the level shifter circuit;
    a bias circuit, coupled between the output terminal and the well of the output circuit, which biases the well proportional to the third voltage swing responsive to the third signal being received at the output terminal; and
    a feedback circuit, coupled between the output terminal and the second transistor of the output circuit, which deactivates the second transistor responsive to the third signal being received at the output terminal.

16. The driver circuit according to claim 15, further comprising a further level shifter circuit, coupled between the input terminal and the second transistor of the output circuit, which translates the first signal to a fourth signal having a fourth voltage swing.

17. The driver circuit according to claim 16, wherein the fourth voltage swing is smaller than the second voltage swing.

18. The driver circuit according to claim 16, wherein the fourth voltage swing ranges from about 0.6 volts to about 1.9 volts.

19. The driver circuit according to claim 15, wherein the bias circuit biases the well to a potential substantially as high as an upper level of the third voltage swing.

20. The driver circuit according to claim 15, wherein the level shifter circuit includes voltage regulation circuitry which regulates a switching rate of the driver circuit.

21. The driver circuit according to claim 15, wherein the transistors of the output circuit are pFETs and the well is an n-well.

* * * * *